(12) United States Patent
Yoon et al.

(10) Patent No.: US 11,574,677 B2
(45) Date of Patent: Feb. 7, 2023

(54) NONVOLATILE MEMORY DEVICE WITH VERTICAL STRING INCLUDING SEMICONDUCTOR AND RESISTANCE CHANGE LAYERS, AND METHOD OF OPERATING THE SAME

(71) Applicants: Samsung Electronics Co., Ltd., Suwon-si (KR); SEOUL NATIONAL UNIVERSITY R&DB FOUNDATION, Seoul (KR)

(72) Inventors: Jungho Yoon, Yongin-si (KR); Cheol Seong Hwang, Seoul (KR); Soichiro Mizusaki, Suwon-si (KR); Youngjin Cho, Suwon-si (KR)

(73) Assignees: Samsung Electronics Co., Ltd., Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 17/385,263

(22) Filed: Jul. 26, 2021

(65) Prior Publication Data

US 2021/0350851 A1    Nov. 11, 2021

Related U.S. Application Data

(63) Continuation of application No. 16/802,803, filed on Feb. 27, 2020, now Pat. No. 11,087,839.

(30) Foreign Application Priority Data

Jul. 31, 2019    (KR) .................. 10-2019-0093430

(51) Int. Cl.
*G11C 7/22*    (2006.01)
*G11C 13/00*    (2006.01)
(Continued)

(52) U.S. Cl.
CPC ........ *G11C 13/004* (2013.01); *G11C 13/0026* (2013.01); *G11C 13/0028* (2013.01);
(Continued)

(58) Field of Classification Search
CPC .............. G11C 13/004; G11C 13/0026; G11C 13/0028; G11C 13/0069;
(Continued)

(56) References Cited

U.S. PATENT DOCUMENTS 9,196,657 B2    11/2015    Cho
9,293,510 B1    3/2016     Park
(Continued)

OTHER PUBLICATIONS

M. Kinoshita et al., 'Scalable 3-D vertical chain-cell-type phase-change memory with 4F2 poly-Si diodes' *Symposium on VLSI Technology Digest of Technical Papers*, IEEE, 2012.
(Continued)

*Primary Examiner* — Mushfique Siddique
(74) *Attorney, Agent, or Firm* — Harness, Dickey & Pierce, P.L.C.

(57) ABSTRACT

A nonvolatile memory device and a method of operating the same are provided. The nonvolatile memory device may include a memory cell array having a vertical stack-type structure, a control logic, and a bit line. The memory cell array may include memory cells that each include corresponding portions of a semiconductor layer and a resistance change layer. The control logic, in a read operation, may be configured to apply a first voltage to a non-select memory cell and a second voltage to a non-select memory cell. The first voltage turns on current only in the semiconductor layer portion of the non-select memory cell. The second voltage turns on current in both the semiconductor layer and resistance change layer portions of the select memory cell. The
(Continued)

bit line may be configured to apply a read voltage to the select memory cell during the read operation.

21 Claims, 14 Drawing Sheets

(51) Int. Cl.
*H01L 27/24* (2006.01)
*H01L 45/00* (2006.01)

(52) U.S. Cl.
CPC ...... *G11C 13/0069* (2013.01); *H01L 27/2454* (2013.01); *H01L 27/2481* (2013.01); *H01L 45/08* (2013.01); *H01L 45/1206* (2013.01); *H01L 45/145* (2013.01); *G11C 2013/0045* (2013.01); *G11C 2013/0078* (2013.01)

(58) Field of Classification Search
CPC .... G11C 2013/0045; G11C 2013/0078; H01L 45/08; H01L 45/1206; H01L 27/2481; H01L 27/2454; H01L 45/145
See application file for complete search history.

(56) References Cited

U.S. PATENT DOCUMENTS

| | | |
|---|---|---|
| 9,947,685 B2 | 4/2018 | Fujii et al. |
| 2008/0239799 A1 | 10/2008 | Watanabe |
| 2012/0087178 A1 | 4/2012 | Watanabe et al. |
| 2012/0211718 A1 | 8/2012 | Shima et al. |
| 2013/0228739 A1* | 9/2013 | Sasago ............... H01L 27/2409 257/4 |
| 2013/0328005 A1* | 12/2013 | Shin ................... H01L 27/2436 257/1 |
| 2016/0064454 A1* | 3/2016 | Park ..................... H01L 45/147 257/5 |
| 2017/0092355 A1 | 3/2017 | Kurotsuchi et al. |
| 2017/0186769 A1 | 6/2017 | Son et al. |
| 2018/0075903 A1 | 3/2018 | Ogiwara et al. |
| 2020/0091233 A1* | 3/2020 | Takashima ............ H01L 27/249 |
| 2020/0161328 A1 | 5/2020 | Yoon et al. |

OTHER PUBLICATIONS

Notice of Allowance dated Apr. 7, 2021, issued in corresponding U.S. Appl. No. 16/802,803.

* cited by examiner

NONVOLATILE MEMORY DEVICE WITH VERTICAL STRING INCLUDING SEMICONDUCTOR AND RESISTANCE CHANGE LAYERS, AND METHOD OF OPERATING THE SAME

CROSS-REFERENCE TO RELATED APPLICATION

This application is a continuation of U.S. application Ser. No. 16/802,803, filed Feb. 27, 2020, which claims the benefit of Korean Patent Application No. 10-2019-0093430, filed on Jul. 31, 2019, in the Korean Intellectual Property Office, the disclosures of each of which are incorporated herein in their entirety by reference.

BACKGROUND

1. Field

The present disclosure relates to nonvolatile memory devices and methods of operating the same.

2. Description of Related Art

As a semiconductor memory device, a nonvolatile memory device includes a plurality of memory cells that maintain information even when power is turned-off and, when power is supplied, the stored information may be used. As an example of a nonvolatile memory device, the non-volatile memory device may be used in a mobile phone, a digital camera, a portable digital assistant (PDA), a mobile computer device, a fixed computer device, and other devices.

Recently, studies have been conducted about using a three-dimensional (or vertical) NAND (VNAND) on a chip that forms a next-generation neuromorphic computing platform or a neural network.

In particular, there is a need to develop a technology having a high integrated low power characteristic and allowing random access to a memory cell.

SUMMARY

Provided are nonvolatile memory devices in which resistance states may be distributed in a linear scale form and methods of operating the nonvolatile memory devices.

Additional aspects will be set forth in part in the description which follows and, in part, will be apparent from the description, or may be learned by practice of the presented embodiments of the disclosure.

According to an aspect of an embodiment, a memory device includes a memory cell array, a control logic, and a bit line. The memory cell array has a vertical stack-type structure including a semiconductor layer and a resistance change layer. The memory cell array includes a plurality of memory cells that each include a corresponding portion of the semiconductor layer and a corresponding portion of the resistance change layer. The control logic, in a read operation, is configured to apply a first voltage to a non-select memory cell and the first voltage has a level to turn on current only in the corresponding portion of the semiconductor layer of the non-select memory cell. The control logic, during the read operation, is configured to apply a second voltage to a select memory cell and the second voltage has a level to turn on current in both the corresponding portion of the semiconductor layer and the corresponding portion of the resistance change layer of the select memory cell. The non-select memory cell and the select memory cell are among the plurality of memory cells of the memory cell array. The bit line is connected to the memory cell array. The bit line is configured to apply a read voltage to the select memory cell during the read operation.

In some embodiments, an absolute value of the second voltage may be less than an absolute value of the first voltage.

In some embodiments, the absolute value of the second voltage may be greater than an absolute value of a third voltage. The third voltage may have a level to turn on current in the corresponding portion of the resistance change layer, based on the control logic applying the third voltage to the select memory cell.

In some embodiments, the control logic, in a program operation, may be configured to apply the first voltage to the non-select memory cell to turn on current only in the corresponding portion of the semiconductor layer of the non-select memory cell. The control logic, in the program operation, may be configured to apply the second voltage to the select memory cell to turn on current in both the corresponding portion of the semiconductor layer and the corresponding portion of the resistance change layer of the select memory cell. The bit line may be configured to apply a program voltage to the select memory cell during the program operation.

In some embodiments, the second voltage may have a magnitude so that the corresponding portion of the semiconductor layer of the select memory cell may have a resistance magnitude in a range of $10^4\Omega$ through $10^{12}\Omega$, based on the control logic applying the second voltage to the select memory cell.

In some embodiments, the second voltage may have a magnitude so that a ratio of a maximum value to a minimum value of a composite resistance of the corresponding portion of the semiconductor layer and the corresponding portion of the resistance change layer of the select memory cell may be 10 or less, based on the control logic applying the second voltage to the select memory cell.

In some embodiments, the second voltage may have a magnitude so that a resistance of the corresponding portion of the semiconductor layer corresponding of the select memory cell may be equal to or greater than a minimum resistance of the corresponding portion of the resistance change layer of the select memory cell, based on the control logic applying the second voltage to the select memory cell.

In some embodiments, the second voltage may have a magnitude so that a resistance of the corresponding portion of the semiconductor layer corresponding of the select memory cell may be equal to or less than a maximum resistance of the corresponding portion of the resistance change layer corresponding to the select memory cell, based on the control logic applying the second voltage to the select memory cell.

In some embodiments, the corresponding portion of the semiconductor layer and the corresponding portion of the resistance change layer of the select memory cell may have a parallel connection structure.

In some embodiments, the memory cell array may include the semiconductor layer extending in a first direction, a plurality of gates and a plurality of insulating layers extending in a second direction perpendicular to the first direction and alternately disposed to each other, a gate insulating layer, and the resistance change layer extending in the first direction on the semiconductor layer. The gate insulating layer may extend in the first direction between the plurality of gates, the plurality of insulating layers, and the semiconductor layer.

In some embodiments, the resistance change layer contacts the semiconductor layer.

In some embodiments, the resistance change layer may be spaced apart from the gate insulating layer with the semiconductor layer therebetween.

In some embodiments, the resistance change layer may include a material in which a resistance is changed by a phenomenon of oxygen vacancies or a current conduction mechanism by trap/detrap of electrons.

In some embodiments, the resistance change layer may include one or more transition metal oxides, one or more transition metal nitrides, or both the one or more transition metal oxides and one or more transition metal nitrides.

According to an aspect of an embodiment, a method of operating a non-volatile memory device includes: applying a first voltage to a non-select memory cell among a plurality of memory cells of a memory cell array, applying a second voltage to a select memory cell among the plurality of memory cells of the memory cell array, and applying a read voltage to the select memory cell of the memory cell array. The memory cell array has a vertical stack-type structure including a semiconductor layer and a resistance change layer. Each of the plurality of memory cells includes a corresponding portion of the semiconductor layer and a corresponding portion of the resistance change layer. The first voltage has a level to turn on current only in the corresponding portion of the semiconductor layer of the non-select memory cell. The second voltage has a level to turn on current in both the corresponding portion of the semiconductor layer and the corresponding portion of resistance change layer of the select memory cell.

In some embodiments, an absolute value of the second voltage may be less than an absolute value of the first voltage.

In some embodiments, an absolute value of the second voltage may be greater than a third voltage. The third voltage may have a level to turn on current in the corresponding portion of the resistance change layer of the select memory cell of the memory cell array, based on applying the third voltage to the select memory cell.

In some embodiments, the second voltage may have a magnitude so that a ratio of a maximum value to a minimum value of a composite resistance of the corresponding portion of the semiconductor layer and the corresponding portion of the resistance change layer of the select memory cell may be 10 or less, based on applying the second voltage to the select memory cell.

In some embodiments, the second voltage may have a magnitude so that a resistance of the corresponding portion of the semiconductor layer of the select memory cell may be equal to or greater than the minimum resistance of the corresponding portion of the resistance change layer of the select memory cell, based on applying the second voltage to the select memory cell.

In some embodiments, the corresponding portion of the semiconductor layer and the corresponding portion of the resistance change layer of the selected memory cell have a parallel connection structure.

According to an aspect of an embodiment, a memory device may include a substrate, a plurality of cell strings on the substrate and spaced apart from each other, a plurality of bit lines on the substrate, a plurality of word lines on the substrate, and a control logic. Each of the plurality of cells strings may include a semiconductor layer and a resistance change layer on the substrate. Each of the plurality of cell strings may include a plurality of memory cells stacked on top of each other on a string selection transistor. Each memory cell of the plurality of memory cells, in a same cell string among the plurality of cell strings, each may include a corresponding portion of the semiconductor layer and a corresponding portion of resistance change layer in the same cell string. Each of the bit lines may be connected to a corresponding one of the plurality of cell strings arranged in a same column on the substrate. The plurality of bit lines may be configured to apply a read voltage to a select memory cell during a read operation using a selected bit line among the plurality of bit lines. The select memory cell and a non-select memory cell may be among the plurality of memory cells on the substrate. Each of the plurality of word lines may be connected to the plurality of memory cells at a same height among the plurality of cell strings arranged in a same row on the substrate. The control logic, in the read operation, may be configured to apply a first voltage to a non-select memory cell using an unselected word line among the plurality of word lines. The first voltage may have a level to turn on current only in the corresponding portion of the semiconductor layer of the non-select memory cell. The control logic, during the read operation, may be configured to apply a second voltage to the select memory cell using a selected word line among the plurality of word lines. The second voltage may have a level to turn on current in both the corresponding portion of the semiconductor layer and the corresponding portion of the resistance change layer of the select memory cell.

In some embodiments, the semiconductor layer may include a silicon material.

In some embodiments, the resistance change layer may include one or more transition metal oxides, one or more transition metal nitrides, or both the one or more transition metal oxides and one or more transition metal nitrides.

In some embodiments, the corresponding portion of the semiconductor layer and the corresponding portion of the resistance change layer, of a same memory cell among the plurality of memory cells, may have a parallel connection structure.

In some embodiments, the memory device may further include a common source line in the substrate. Two or more of the plurality of cell strings may be on the common source line. Each of the plurality of cell strings may further includes a gate insulating layer contacting a first surface of the semiconductor layer that is opposite a second surface of the semiconductor layer that directly contacts the resistance change layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
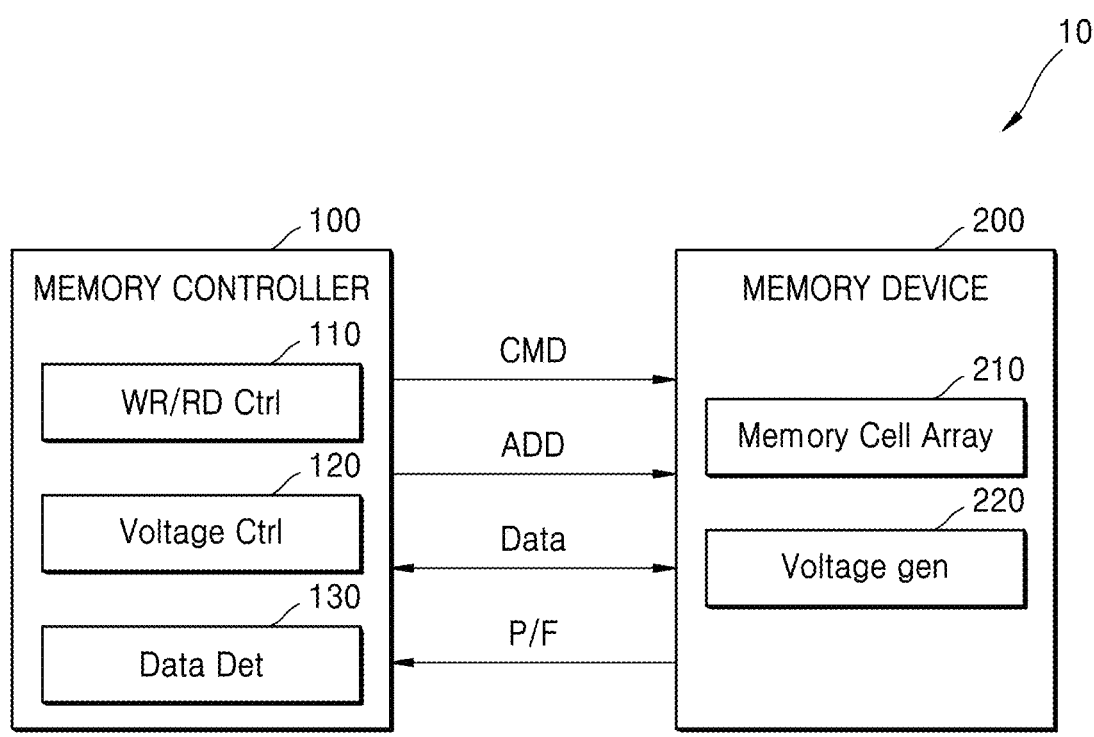
FIG. 1 is a block diagram of a memory system according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The phrases "in some embodiments" or "in one embodiment" appearing in various places in the specification are not necessarily all referring to the same embodiment.

Some embodiments of the present disclosure may be represented by functional block configurations and various processing steps. Some or all of these functional blocks may be realized in various numbers of hardware and/or software configurations that perform particular functions. For example, the functional blocks of the present disclosure may be realized by one or more microprocessors or by circuit configurations for a given function. Also, for example, the functional blocks of the present disclosure may be realized in various programming or scripting languages. The functional blocks may be realized in algorithms executing on one or more processors. Also, the present disclosure may employ the prior art for electronic environment configuration, signal processing, and/or data processing. Terms, such as "mechanism", "element", "means" and "configuration" may be widely used and are not limited to mechanical and physical configurations.

Also, connecting lines or connecting members between components shown in the drawings are merely illustrative of functional connections and/or physical or circuit connections. In an actual device, the connections between components may be represented by various functional connections, physical connections, or circuit connections that are replaceable or added.

It will be understood that the term "comprise" or "include" should not be construed as necessarily including various constituent elements and various operations described in the specification, and also should not be construed that portions of the constituent elements or operations of the various constituent elements and various operations may not be included or additional constituent elements and operations may further be included.

It will also be understood that when an element is described using an expression "above" or "on", the position of the element may include not only the element being "immediately on/under/left/right in a contact manner" but also being "on/under/left/right in a non-contact manner". Hereinafter, only embodiments will be described in detail with reference to the accompanying drawings.

Terms, such as first and second may be used to describe various components, but the components should not be limited by the terms. The terms are used only to distinguish one component from another.

Hereinafter, the present disclosure will be described in detail with reference to the accompanying drawings.

FIG. 1 is a block diagram of a memory system 10 according to an embodiment.

Referring to FIG. 1, the memory system 10 may include a memory controller 100 and a memory device 200. The memory controller 100 may perform a control operation with respect to the memory device 200, and, as an example, the memory controller 100 may perform read and erase operations of a program (or write) with respect to the memory device 200 by providing an address ADD and a command CMD to the memory device 200. Also, data for operating a program and read data may be transmitted and received between the memory controller 100 and the memory device 200.

The memory device 200 may include a memory cell array 210 and a voltage generator 220. The memory cell array 210 may include a plurality of memory cells disposed in regions where a plurality of word lines and a plurality of bit lines cross each other. The memory cell array 210 may include nonvolatile memory cells that non-volatilely store data, and as nonvolatile memory cells, the memory cell array 210 may include flash memory cells, such as a NAND flash memory cell array or a NOR flash memory cell array, etc. Hereinafter, an example where the memory cell array 210 includes a flash memory cell array is described. Accordingly, embodiments according to the present disclosure will be described in detail assuming that the memory device 200 is a nonvolatile memory device.

The memory controller 100 may include a write/read controller 110, a voltage controller 120, and a data determiner 130. In example embodiments, the memory controller 100 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The memory controller 100 may operate in response to requests from a host (not shown) and may be configured to access the memory device 200 and control operations discussed below, thereby transforming the memory controller 100 into a special purpose controller. As discussed below, the memory controller 100 may improve the functioning of the memory device 200 by reducing a distribution of resistance states in the memory device 200 for a read operation.

The write/read controller 110 may generate an address ADD and a command CMD for performing a program/read and erase operation with respect to the memory cell array 210. Also, the voltage controller 120 may generate a voltage control signal for controlling at least one voltage level used in the nonvolatile memory device 200. As an example, the voltage controller 120 may read data from the memory cell array 210 or generate a voltage control signal for controlling a voltage level of a word line for programming data in the memory cell array 210.

The data determiner 130 may perform a determination operation with respect to the data read from the memory device 200. For example, the number of on-cells and/or off-cells among the memory cells may be determined by determining the data read from the memory cells. As an example of operation, when a program is performed with respect to a plurality of memory cells, a state of data of the memory cells may be determined by using a desired and/or alternatively predetermined read voltage, and thus, it may be determined whether the program is normally completed with respect to all cells.

The memory device 200 may include the memory cell array 210 and the voltage generator 220. As described above, the memory cell array 210 may include nonvolatile memory cells, and as an example, the memory cell array 210 may include flash memory cells. Also, the flash memory cells may be realized in various forms, for example, the memory cell array 210 may include three-dimensional (or vertical) NAND (VNAND) memory cells.

Figure 2:
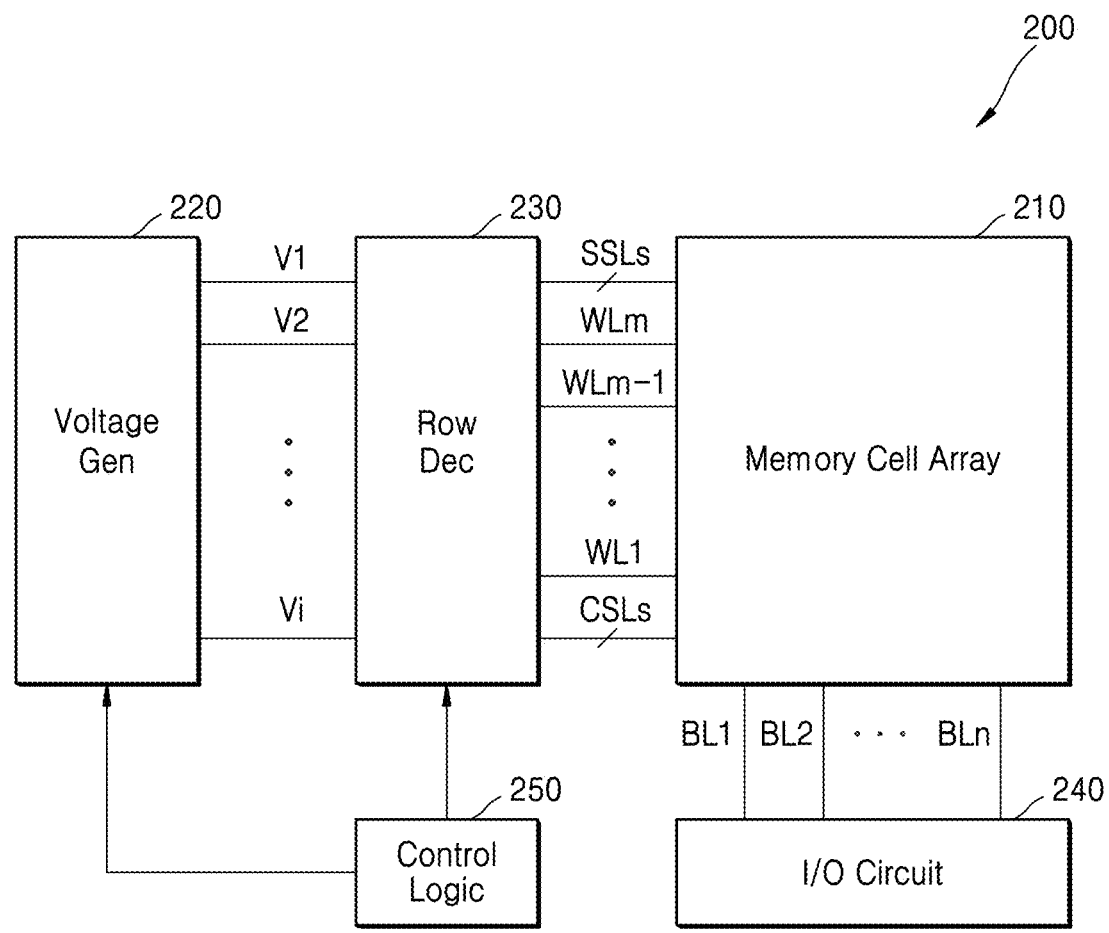
FIG. 2 is a block diagram illustrating an implementation of a memory device of FIG. 1.

FIG. 2 is a block diagram illustrating an implementation of the memory device of FIG. 1.

As depicted in FIG. 2, the memory device 200 may further include a row decoder 230, an input/output circuit 240, and a control logic 250.

The memory cell array 210 may be connected to at least one string select line SSL, a plurality of word lines WLs (WL1 through WLm, normal word lines WLs, and dummy word lines WLs), and at least one common cell CSL, and also, may be connected to a plurality of bit lines BL1 through BLn. The voltage generator 220 may generate at least one word line voltage, for example word line voltages V1 through Vi, and the word line voltages V1 through Vi may be provided to the row decoder 230. A signal for performing a program/read/erase operation may be applied to the memory cell array 210 through the bit lines.

Also, data to be programmed may be provided to the memory cell array 210 through the input/output circuit 240, and the read data may be provided to the outside (for example, a memory controller) through the input/output circuit 240. In example embodiments, the control logic 250 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The control logic 250 may operate in response to requests from memory controller 100 (see FIG. 1) and the control logic 250 may provide various control signals related to a memory operation to the row decoder 230 and the voltage generator 220, thereby transforming the control logic 250 into a special purpose control logic. As discussed below, the control logic 250 may improve the functioning of the memory device 200 by reducing a distribution of resistance states in the memory device 200 for a read operation.

According to the decoding operation of the row decoder 230, the word line voltages V1 through Vi may be provided to the various lines WLs (SSLs, WL1 through WLm, and CSLs). For example, the word line voltages V1 through Vi may include a string select voltage, a word line voltage, and a ground select voltage, the string select voltage may be provided to at least one string select line SSs, the word line voltage may be provided to at least one word line WL, and a ground select voltage may be provided to at least one common source line CSL.

Figure 3:
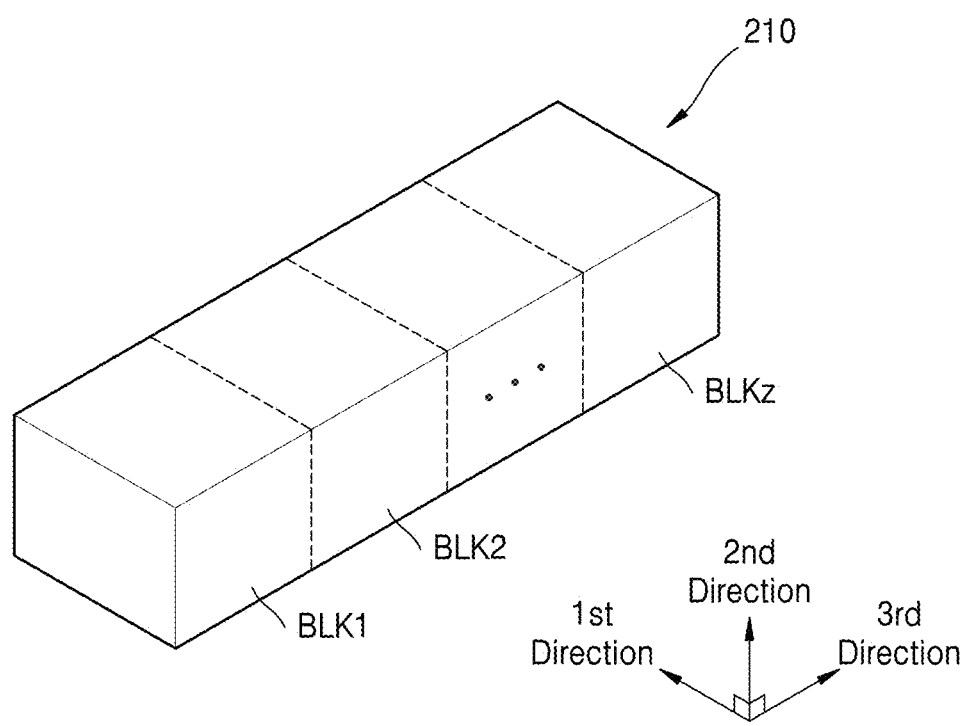
FIG. 3 is a block diagram of a memory cell array according to FIG. 1.

FIG. 3 is a block diagram of the memory cell array 210 according to FIG. 1.

Referring to FIG. 3, the memory cell array 210 includes a plurality of memory blocks BLK1 through BLKz. Each memory block BLK has a three-dimensional structure (or a vertical structure). For example, each memory block BLK includes structures extending in first through third directions. For example, as discussed with reference to FIG. 4, each memory block BLK includes a plurality of cell strings CSs extending in a second direction. For example, a plurality of cell strings CSs may be provided in first and third directions.

Each cell string CS is connected to a bit line BL, a string select line SSL, word lines WLs, and a common source line CSL. That is, each of the memory blocks BLK1 through BLKz may be connected to a plurality of bit lines BLs, a plurality of string select lines SSLs, a plurality of word lines WLs, and a plurality of common source lines CSLs. The memory blocks BLK1 through BLKz will be described in further detail with reference to FIG. 4.

Figure 4:
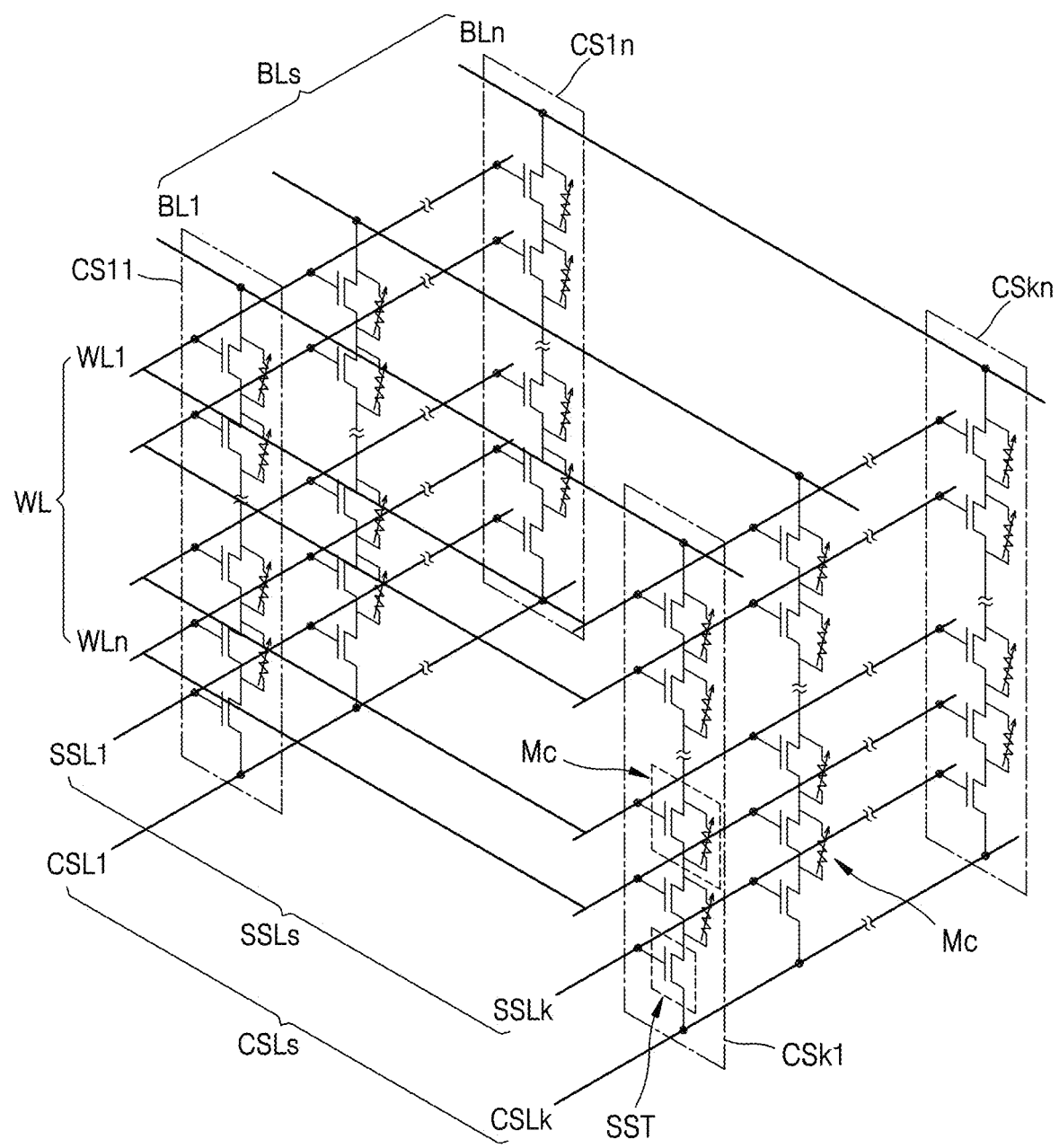
FIG. 4 is a diagram illustrating an equivalent circuit corresponding to a memory block according to an embodiment.

FIG. 4 is a diagram illustrating an equivalent circuit corresponding to a memory block BLKi according to an embodiment. For example, one of the memory blocks BLK1 through BLKz of the memory cell array 210 of FIG. 3 is depicted in FIG. 4.

Referring to FIGS. 3 and 4, the memory block BLKi includes a plurality of cell strings CLs. The plurality of cell strings CSs may form rows and columns by being arranged in a row direction and a column direction.

Each cell string CS11 through CSkn includes memory cells Mcs and a string select transistor SST. The memory cells Mcs and the string select transistors SST of each cell string CS may be stacked in a height direction.

Rows of the plurality of cell strings CSs are respectively connected to different string select lines SSL1 through SSLk. For example, the string select transistors SSTs of the cell strings CS11 through CS1n are commonly connected to the string select line SSL1. The string select transistors SSTs of the cell strings CSk1 through CSkn are commonly connected to the string select line SSLk.

Columns of the plurality of cell strings CSs are respectively connected to different bit lines BL1 through BLn. For example, the memory cells and the string select transistors SSTs of the cell strings CS11 through CSk1 may be commonly connected to the bit line BL1, and the memory cells and the string select transistors SSTs of the cell strings CS1n through CSkn may be commonly connected to the bit line BLn.

Rows of the cell strings CSs may be respectively connected to different common source lines CSL1 through CSLk. For example, the string select transistors SSTs of the cell strings CS11 through CS1n may be commonly connected to a common source line CSL1, and the string select transistors SSTs of the cell strings CSk1 through CSkn may be commonly connected to the common source line CSLk.

Memory cells located at the same height from a substrate (or the string select transistors SSTs) are commonly connected to a same word line WL, and memory cells located at different heights are respectively connected to word lines WL1 through WLm different from each other.

The memory block BLKi shown in FIG. 4 is an example. The technical spirit of the present disclosure is not limited to the memory block BLKi illustrated in FIG. 4. For example, the number of rows of the cell strings CSs may be increased or decreased. As the number of rows of the cell strings CSs is changed, the number of string select lines connected to the rows of the cell strings CSs and the number of cell strings CSs connected to one bit line may also be changed. As the number of rows of the cell strings CSs is changed, the number of common source lines connected to the rows of the cell strings CSs may also be changed.

The number of columns of the cell strings CSs may be increased or decreased. As the number of columns of the cell strings CSs is changed, the number of bit lines connected to the columns of the cell strings CSs and the number of cell strings CSs connected to one string select line may also be changed.

The heights of the cell strings CSs may be increased or decreased. For example, the number of memory cells stacked in each of the cell strings CSs may be increased or decreased. As the number of memory cells stacked in each of the cell strings CSs is changed, the number of word lines WL may also be changed. For example, the string select transistor provided to each of the cell strings CSs may be increased. As the number of string select transistors provided to each of the cell strings CSs is changed, the number of string select lines or a common source line may also be changed. When the number of string select transistors increases, the string select transistors may be stacked in the same form as memory cells MCs.

For example, writing and reading may be performed in units of rows of cell strings CSs. The cell strings CSs may be selected in units of rows by the common source lines CSLs, and the cell strings CSs may be selected in units of rows by the string select lines SSLs. Also, a voltage may be applied to the common source lines CSLs in a unit of at least two common source lines. A voltage may be applied to all of the common source lines CSLs as one unit.

In the selected row of the cell strings CSs, writing and reading may be performed in units of pages. A page may be one row of memory cells connected to a same word line WL. In the selected row of the cell strings CSs, the memory cells may be selected in units of pages by the word lines WLs.

Meanwhile, each of the memory cells MCs may correspond to a circuit in which a transistor and a resistor are connected in parallel.

Figure 5:
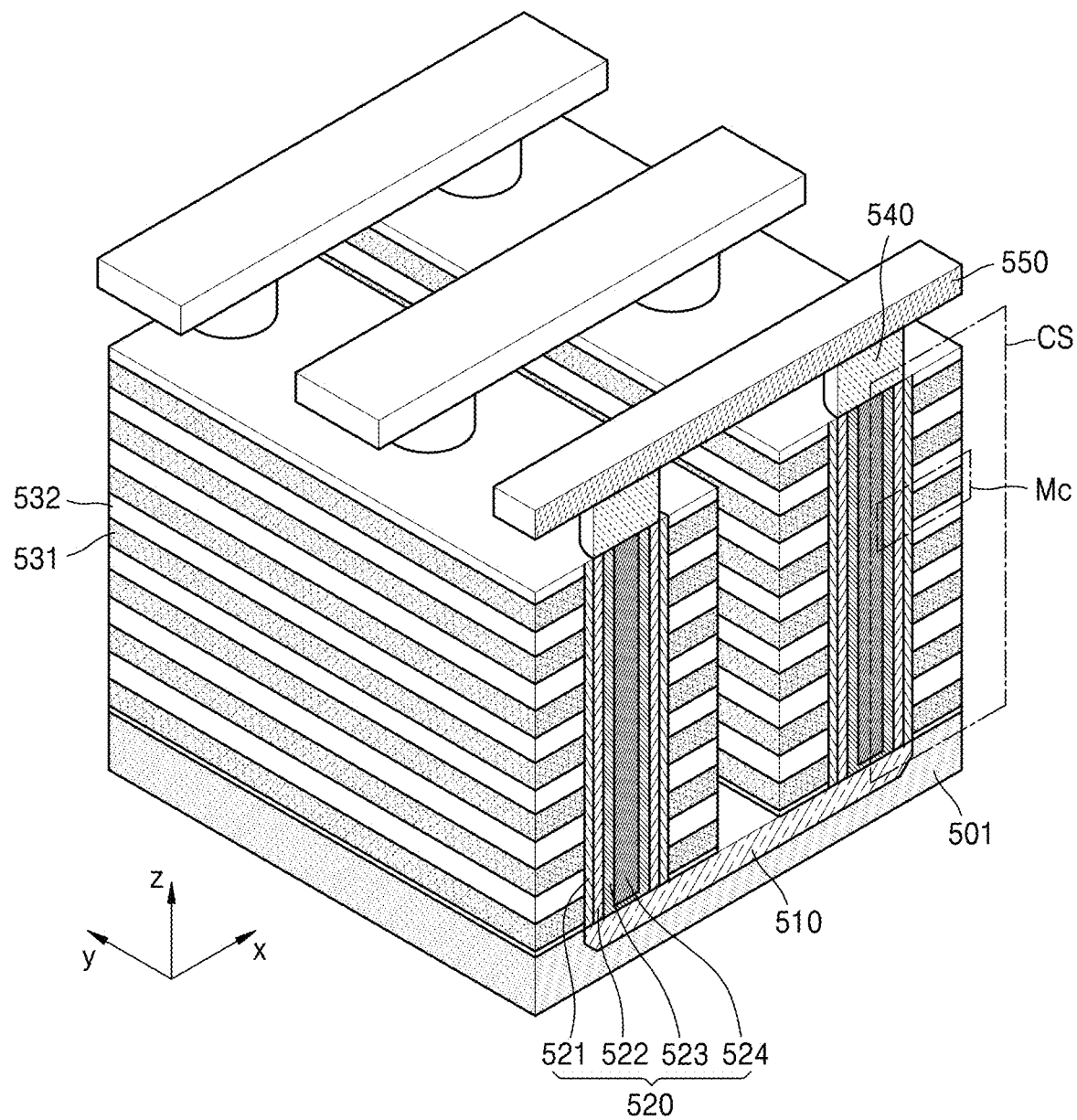
FIG. 5 is a diagram of a physical structure corresponding to a memory block according to an embodiment.
Figure 6A:
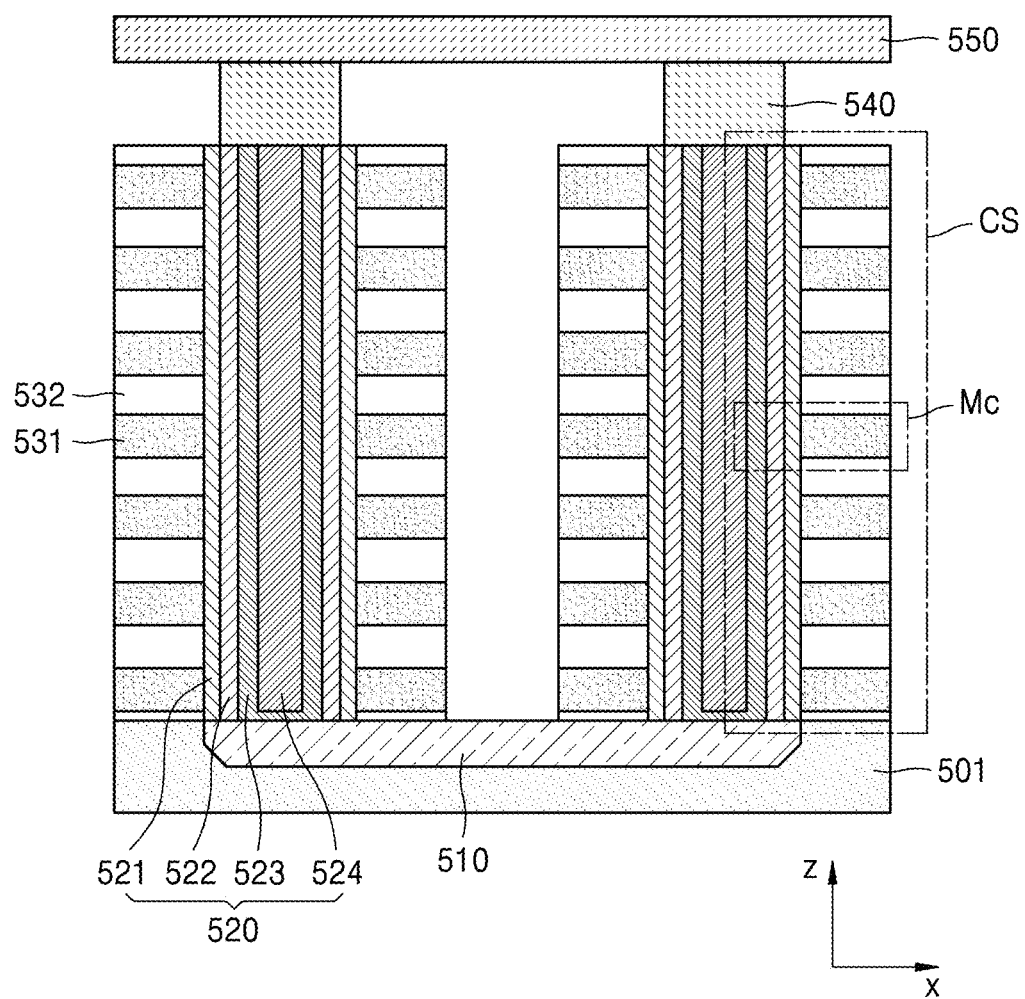
FIG. 6A is a cross-sectional view of an XZ plane of the memory block of FIG. 5.
Figure 6B:
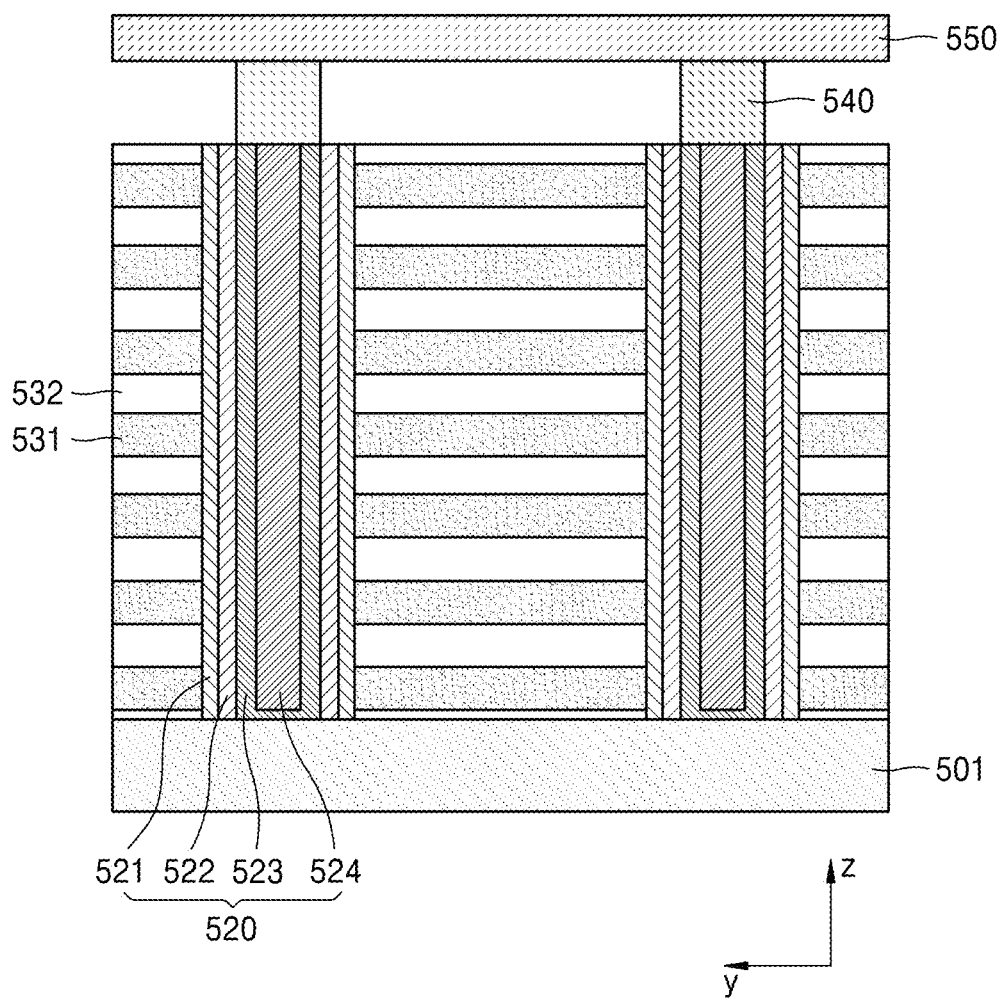
FIG. 6B is a cross-sectional view of a YZ plane of the memory block of FIG. 5.

FIG. 5 is a diagram of a physical structure corresponding to a memory block according to an embodiment, FIG. 6A is a cross-sectional view of an XZ plane of the memory block of FIG. 5, and FIG. 6B is a cross-sectional view of a YZ plane of the memory block of FIG. 5.

Referring to FIGS. 5, 6A, and 6B, a substrate 501 is provided. As an example, the substrate 501 may include a silicon material doped with a first type dopant. For example, the substrate 501 may include a silicon material doped with a p-type dopant. For example, the substrate 501 may be a p-type well (for example, a pocket p well). Hereinafter, the substrate 501 is assumed as p-type silicon. However, the substrate 501 is not limited to p-type silicon.

A doped region 510 is provided on the substrate 501. For example, the doped region 510 may have a second type dopant that is different from the substrate 501. For example, the doped region 510 may be an n-type. Hereinafter, the doped region 510 is assumed as an n-type. However, the doped region 510 is not limited to an n-type. The doped region 510 may be a common source line.

A plurality of gates 531 and a plurality of insulating layers 532 extending in a horizontal direction may be alternately arranged on the substrate 501. That is, the plurality of gates 531 and the plurality of insulating layers 532 may be stacked crossing each other in a vertical direction perpendicular to the horizontal direction. For example, the gate 531 may include at least one of a metal material (for example, copper, silver, etc.) and highly doped silicon, and the plurality of insulating layers 532 may include silicon oxide, but is not limited thereto. Each gate 531 is connected to one of a word line WL and a string select line SSL.

A pillar 520 that vertically penetrates the plurality of gates 531 and the plurality of insulating layers 532, which are alternately arranged, is provided.

The pillar 520 may include a plurality of layers. In one embodiment, the outermost layer of the pillar 520 may be a gate insulating layer 521. For example, the gate insulating layer 521 may include silicon oxide. The gate insulating layer 521 may be conformally deposited on the pillar 520.

Also, a semiconductor layer 522 may be conformally deposited along an inner surface of the gate insulating layer 521. In one embodiment, the semiconductor layer 522 may include a silicon material doped with the first type dopant. The semiconductor layer 522 may include a silicon material doped with the same type as the substrate 501, and, for example, when the substrate 501 includes a silicon material doped with a p-type dopant, the semiconductor layer 522 may also include a silicon material doped with a p-type dopant. Alternatively, the semiconductor layer 522 may also include materials such as Ge, IGZO, GaAs, etc.

A resistance change layer 523 may be disposed along an inner surface of the semiconductor layer 522. The resistance change layer 523 may be disposed in contact with the semiconductor layer 522 and conformally deposited on the semiconductor layer 522. In one embodiment, the resistance change layer 523 may include a material in which a resistance varies according to an applied voltage. The resistance change layer 523 may change from a high resistance state to a low resistance state or from a low resistance state to a high resistance state according to a voltage applied to the gate 531. The above resistance change may be a phenomenon due to oxygen vacancies of the resistance change layer 523 or a phenomenon due to a change in a current conduction mechanism by trapping/detrapping of electrons of the resistance change layer 523.

The resistance change layer 523 may include a transition metal oxide and/or a transition metal nitride. In detail, the resistance change layer 523 may include an oxide of at least one element selected from the group consisting of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), praseodymium (Pr), and silicon (Si). Also, the resistance change layer 523 may include silicon nitride and aluminum nitride.

Also, an insulating layer 524 may be filled in the resistance change layer 523. For example, the insulating layer 524 may include silicon oxide.

The semiconductor layer 522 and the resistance change layer 523 may be in contact with the doped region 510, that is, a common source region.

A drain 540 may be provided on pillar 520. The drain 540 may include a silicon material doped with a second type dopant. For example, the drain 540 may include a silicon material doped with an n-type dopant.

A bit line 550 may be provided on the drain 540. The drain 540 and the bit line 550 may be connected through contact plugs. The bit line 550 may include a metal material, for example, the bit line 550 may include polysilicon. The conductive material may be a bit line.

Meanwhile, when compared with FIG. 4, the plurality of gates 531, the plurality of insulating layers 532, the gate insulating layer 521, the semiconductor layer 522, and the resistance change layer 523 are constituent elements of the cell strings CSs. In detail, the gate 531, the gate insulating layer 521, and the semiconductor layer 522 may be some constituent elements of the transistor, and the resistance change layer 523 may be a resistor.

As depicted in the drawings, the semiconductor layer 522 and the resistance change layer 523 of the transistor are directly connected to each other so that the resistance change layer 523 may have a high resistance state or a low resistance state, and thus, '0' and '1' may be recorded in the memory cell MC. In each memory cell MC, the semiconductor layer 522 and the resistance change layer 523 of the transistor are connected in parallel, and the parallel structure is continuously arranged in a vertical direction, and thus, the cell string CS is formed. Also, the common source line 510 and the bit line 550 respectively may be connected to both ends of the cell string CS. Also, a voltage may be applied to the common source line 510 and the bit line 550, and thus, processes of programing, reading, and erasing may be performed in the plurality of memory cells MCs.

According to the present disclosure, instead of constructing a memory block by using a phase change material, the memory block is formed using the resistance change layer 523, and thus, the problem of generating heat and stress (pressure) caused by using a phase change material may be limited and/or solved. Also, by configuring and operating a memory block as described above, even when repeatedly operating memory cells included in the memory block, ion movement between adjacent memory cells, a leakage current as a result of the ion movement, and an operation failure may be limited and/or prevented. Also, the memory block according to the present disclosure may solve a scaling issue between memory cells in a next-generation VNAND, and thus, integration density may be dramatically increased.

Meanwhile, the memory block according to the present disclosure may be realized in a chip form and used as a neuromorphic computing platform. Also, the block according to the present disclosure may be realized in a chip form and used to construct a neural network.

Meanwhile, the memory controller 100 may control the memory device 200 to be operated in a program mode.

Figure 7:
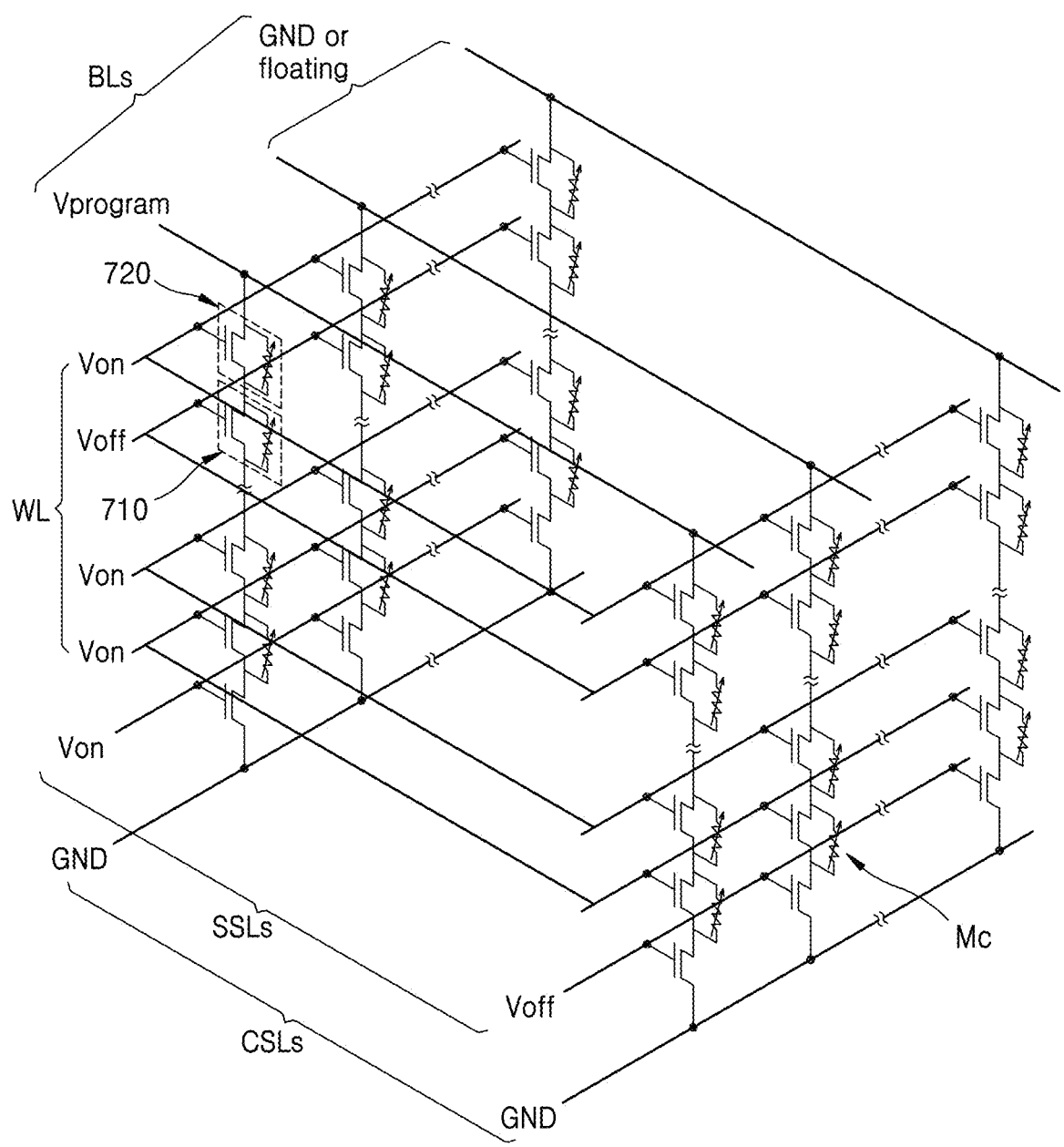
FIG. 7 is a diagram of an equivalent circuit of the memory block of FIG. 4 in a program mode of a nonvolatile memory device according to an embodiment.

FIG. 7 is a diagram of an equivalent circuit of the memory block of FIG. 4 in a program mode of a nonvolatile memory device according to an embodiment.

Each of a plurality of memory cells 710 and 720 of FIG. 7 may include the gate 531, the gate insulating layer 521, the resistance change layer 523, and the semiconductor layer 522 of FIG. 5.

Each of a plurality of memory cells 710 and 720 may include a select memory cell 710 and a non-select memory cell 720. The program mode of a nonvolatile device may denote a mode in which a program operation is performed on a memory cell included in a memory block, and the select memory cell 710 may denote a memory cell that is a target of the program operation.

Referring to FIGS. 1, 2, and 7, the control logic 250 may apply a turn-on voltage Von to a string select line SSL connected to the select memory cell 710 among a plurality of string select lines SSLs. The control logic 250 applies the turn-on voltage Von to a word line WL connected to the non-select memory cells 720 among a plurality of word lines WLs, and the control logic 250 may apply a turn-off voltage Voff to the word line WL connected to the select memory cell 710 among the plurality of word lines WLs. Here, the turn-on voltage Von is a voltage having a magnitude to turn-on a transistor, and may be referred to as a voltage that turns-on only the semiconductor layer of the transistor. The turn-off voltage Voff is a voltage having a magnitude to turn-off the transistor and may be referred to as a voltage that limits and/or prevents current from flowing in the semiconductor layer of the transistor. The magnitude of the turn-on voltage Von and the turn-off voltage Voff may vary according to type, thickness, etc. of a material that forms the gate 531, the gate insulating layer 521, the semiconductor layer 522, and the resistance change layer 523, which form a plurality of memory cells MC. In general, an absolute value of the turn-on voltage Von may be greater than an absolute value of the turn-off voltage Voff.

A program voltage Vprogram may be applied to a bit line BL connected to the select memory cell 710 among a plurality of bit lines BLs. The program voltage Vprogram may be provided from the outside, for example, the memory controller 100 through the input/output circuit 240. The program voltage Vprogram is a voltage for writing data in the memory cell MC and may have a different magnitude depending on the data.

Among the plurality of bit lines BLs, the bit line BL that is not connected to the select memory cell 710 may be grounded or floated. Since the bit line BL that is not connected to the select memory cell 710 is grounded or floated, power loss due to a leakage current may be limited and/or prevented. As a result, the control logic 250 may perform a program operation on the select memory cell 710.

In a program mode, as a turn-on voltage Von is applied to the non-select memory cell 720, the semiconductor layer 522 of the non-select memory cell 720 has a conductor characteristic, and as a turn-off voltage Voff is applied to the select memory cell 710, the semiconductor layer 522 of the select memory cell 710 has an insulating characteristic. Thus, a voltage difference according to a program voltage Vprogram occurs in the select memory cell 710. The resistance change layer 523 of the select memory cell 710 may be in a low resistance state as oxygen vacancies move toward the semiconductor layer 522 due to a voltage difference of the select memory cell 710. The low resistance state of the resistance change layer 523 of the select memory cell 710 may denote that a value of resistance in the select memory cell 710 is reduced. The select memory cell 710 may have an ohmic conduction characteristic in the low resistance state of the resistance change layer 523.

Figure 8A:
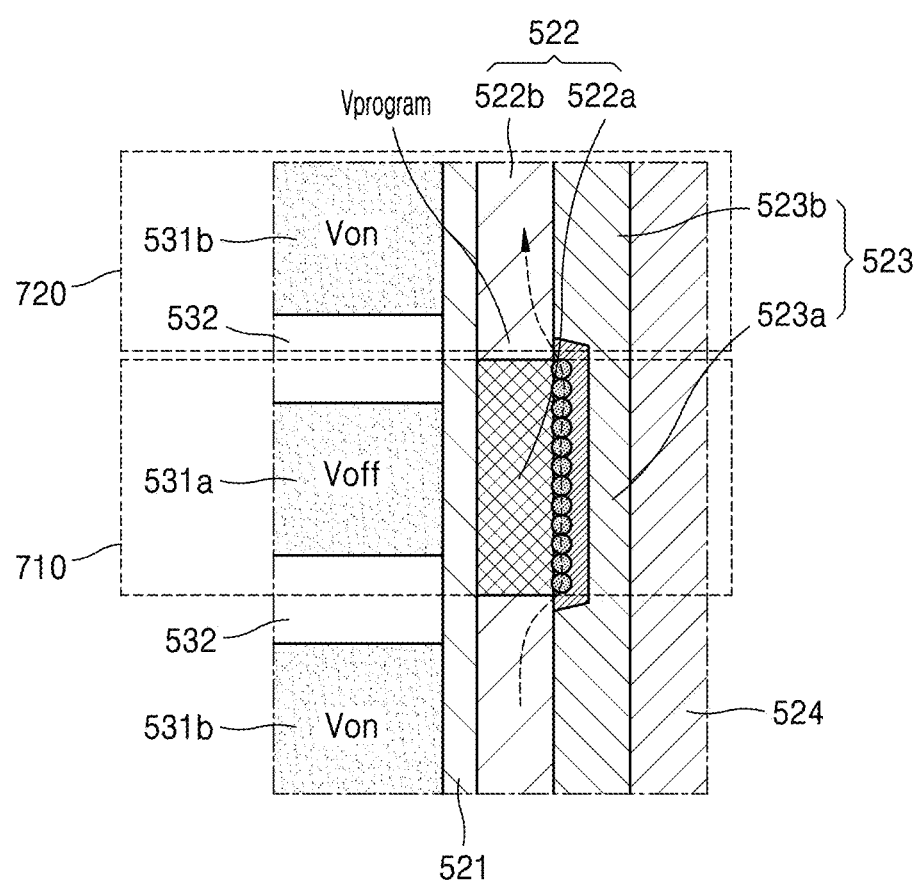
FIGS. 8A and 8B are diagrams illustrating a current movement in a resistance change layer in a program mode according to an embodiment.
Figure 8B:
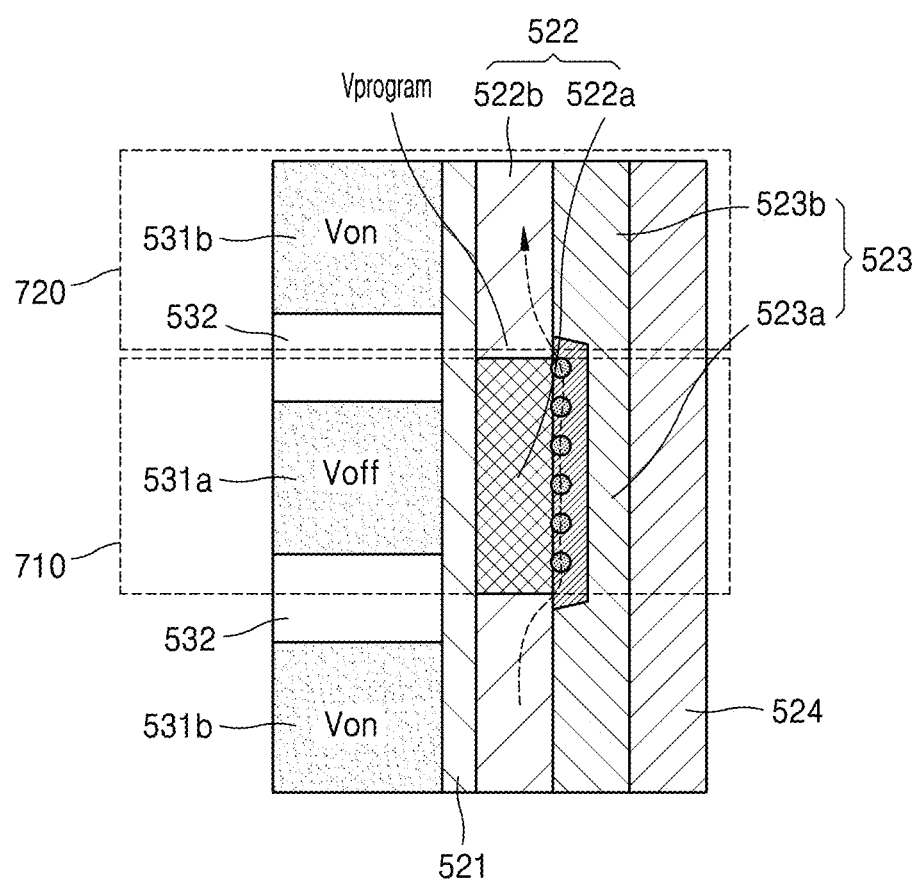

FIGS. 8A and 8B are diagrams illustrating a current movement in a resistance change layer 523 in a program mode according to an embodiment.

As shown in FIGS. 6A and 8A, a memory block may include the gate 531 (e.g., 531a, 531b), the insulating layers 532, the gate insulating layer 521, the semiconductor layer 522 (e.g., 522a, 522b), the resistance change layer 523 (e.g., 523a, 523b), and the insulating layer 524 on a substrate (not shown). The gate insulating layer 521, the semiconductor layer 522, the resistance change layer 523, and the insulating layer 524 may extend in a first direction. The gate 531 and the insulating layers 532 may alternately extend in a second direction perpendicular to the first direction.

Meanwhile, the gate 531, the gate insulating layer 521, and the semiconductor layer 522 may be constituent elements of a transistor, and the resistance change layer 523 may correspond to a resistor.

In a program mode, the control logic 250 (see FIG. 2) may apply a turn-on voltage Von to a gate 531b of a non-select memory cell and apply a turn-off voltage Voff to a gate 531a of a select memory cell. Thus, a semiconductor layer 522b corresponding to the gate 531b of the non-select memory cell may have a conductor characteristic, and a semiconductor layer 522a corresponding to the gate 531a of the select memory cell may have an insulating characteristic. As a program voltage Vprogram is applied to a bit line electrically connected to the select memory cell 710, a voltage difference occurs in the resistance change layer 523a corresponding to the select memory cell 710.

The voltage difference directs oxygen vacancies in the resistance change layer 523a corresponding to the select memory cell 710 in a direction toward the semiconductor layer 522a. As depicted in FIG. 8A, when the density of oxygen vacancies is high in a region close to the semiconductor layer 522a of the resistance change layer 523a, a conductive filament may be formed. Thus, the resistance change layer 523a may be in a low resistance state and the select memory cell 710 may have ohmic conduction characteristics.

Alternatively, as depicted in FIG. 8B, when density of oxygen vacancies is low in a region close to the semiconductor layer 522a of the resistance change layer 523a, electrons are filled in a trap spaced apart by a desired and/or alternatively predetermined distance from the resistance change layer 523a. Thus, the resistance change layer 523a is in a low resistance state due to the change in a current conduction shape, and the select memory cell 710 may have a bulk conduction characteristic, such as Hopping, space charge limited current (SCLC), and Poole-Frenkel.

As a result, a program operation may be performed on the select memory cell 710 by changing the resistance state of the resistance change layer 523a of the select memory cell 710 in response to a program voltage Vprogram.

On the other hand, the resistance state of the resistance change layer 523a generally has a distribution on a logarithmic scale. Thus, a ratio of the highest resistance to the lowest resistance of the resistance change layer 523a may be large, and the deviation may also be large. The resistance change of the resistance change layer 523 may be outside the limit of the dynamic range of a sense amplifier that senses a resistance. Thus, it is difficult to connect the sense amplifier to a memory cell or a memory device.

Figure 9:
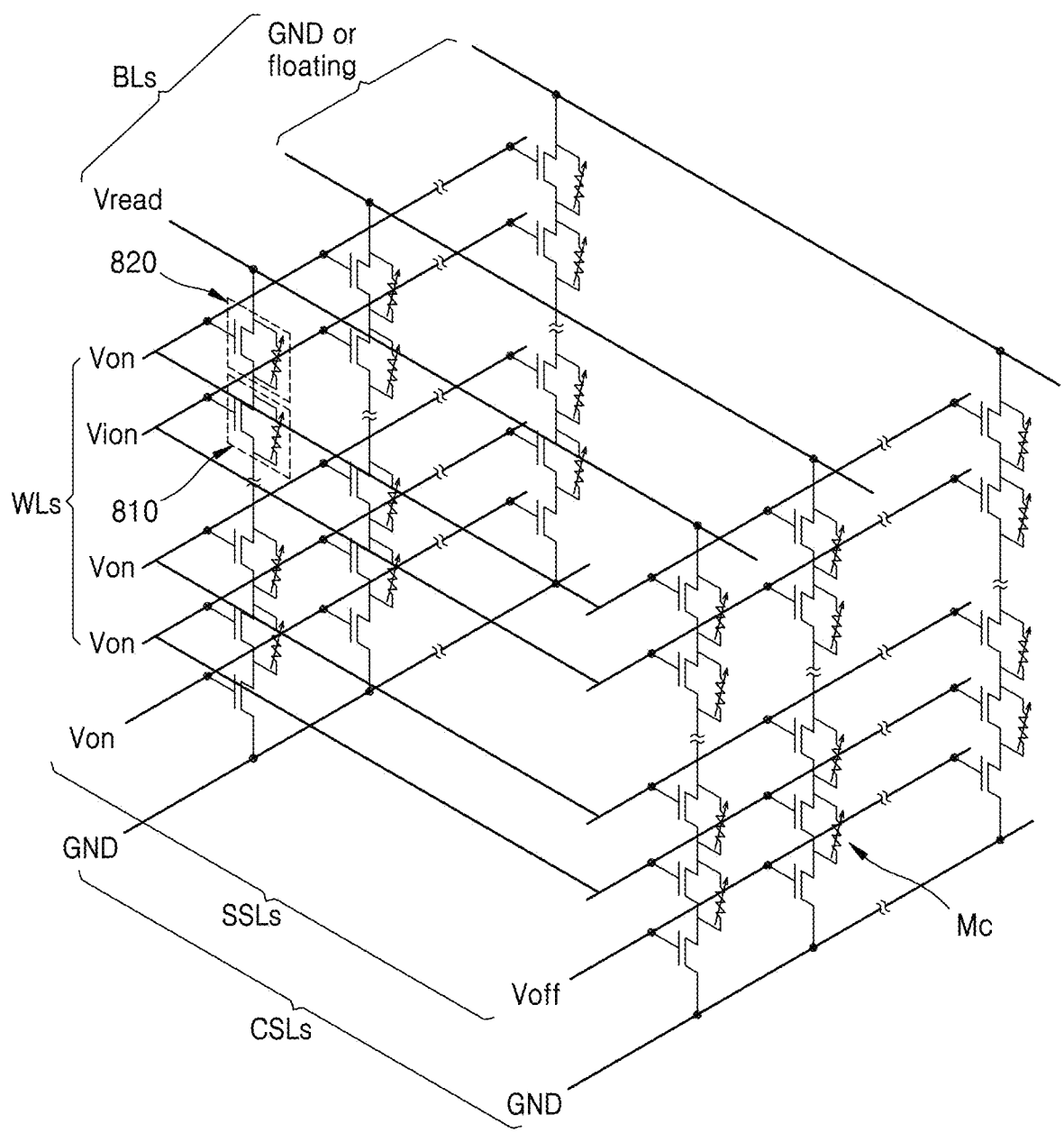
FIG. 9 is a diagram of a circuit in a read mode of a memory block according to an embodiment.

FIG. 9 is a diagram of a circuit in a read mode of a memory block according to an embodiment. Referring to FIG. 9, each of a plurality of memory cells 810 and 820 included in a memory block may include the gate 531, the gate insulating layer 521, the semiconductor layer 522, and the resistance change layer 523 of FIG. 5.

Each of a plurality of memory cells 810 and 820 included in a memory block 800 may include a select memory cell 810 and a non-select memory cell 820. A read mode of a nonvolatile device may denote a mode in which a read operation is performed on a memory cell included in a memory block, and the select memory cell 810 may denote a memory cell that is a target of a read operation.

In a read mode, the control logic 250 may apply a turn-on voltage Von to a string select line SSL connected to the select memory cell 810 among a plurality of string select lines SSLs and may apply a turn-on voltage Von to a word line WL connected to the non-select memory cells 820 among a plurality of word lines WLs. Here, the turn-on voltage Von may be a voltage having a magnitude to turn-on a transistor and may be referred to as a voltage for turning-on only the semiconductor layer 522 of the transistor. The turn-off voltage Voff is a voltage having a magnitude to turn-off a transistor and may be referred to as a voltage to limit and/or prevent a current from flowing through the semiconductor layer 522 of the transistor. A value of the turn-on voltage Von and the turn-off voltage Voff may vary according to type, thickness, etc. of a material that forms the gate 531, the gate insulating layer 521, the semiconductor layer 522, and the resistance change layer 523, which form a plurality of memory cells MC. In general, an absolute value of the turn-on voltage Von may be greater than an absolute value of the turn-off voltage Voff.

Meanwhile, the control logic 250 may apply a current-on voltage Vion to a word line WL connected to the select memory cell 710. The current-on voltage Vion may denote a voltage having a magnitude that allows a current to flow through both the semiconductor layer 522 and the resistance change layer 523 of the transistor included in the select memory cell 710. An absolute value of the current-on voltage Vion may be greater than an absolute value of the turn-off voltage Voff and less than an absolute value of the turn-on voltage Von. A value of the current-on voltage Vion may vary according to type, thickness, etc. of a material that forms the gate 531, the gate insulating layer 521, the semiconductor layer 522, and the resistance change layer 523, which form a plurality of memory cells MC. In particular, the current-on voltage Vion may have a magnitude so that a resistance distribution of the select memory cell 810 has a linear scale.

Also, a read voltage Vread may be applied to a bit line BL connected to the select memory cell 810 among a plurality of bit lines BLs. The read voltage Vread may be provided from the outside, for example, the memory controller 100, through the input/output circuit 240. The read voltage Vread may be a voltage for reading data written in the select memory cell 810. In addition, a bit line BL that is not connected to the select memory cell 810 among a plurality of bit lines BLs may be grounded or floated. Thus, a read operation with respect to the select memory cell 810 may be performed.

Figure 10:
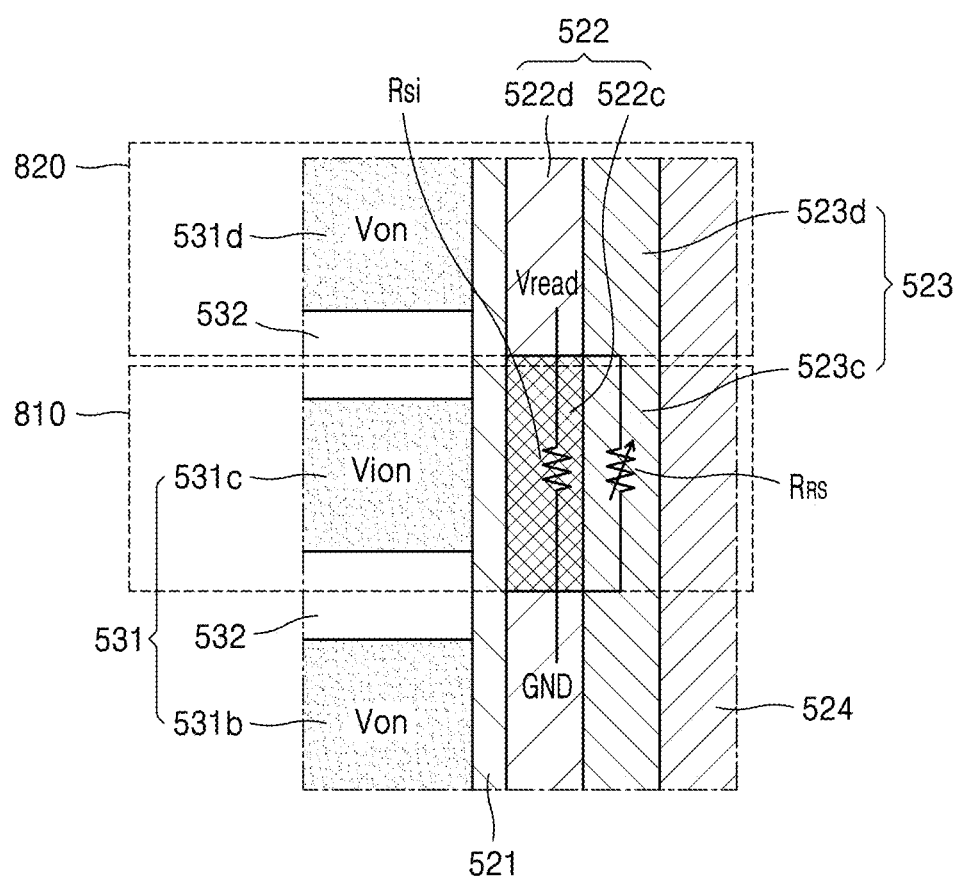
FIG. 10 is a diagram illustrating a current movement in a select memory cell in a read mode according to an embodiment.

FIG. 10 is a diagram illustrating a current movement in the select memory cell 810 in a read mode according to an embodiment.

In a read mode, since a read voltage Vread is applied to a bit line BL connected to the select memory cell 810 and a turn-on voltage Von is applied to the non-select memory cell 820, a semiconductor layer 522d of the non-select memory cell 820 has a conductor characteristic. Thus, a read current Iread flows through the semiconductor layer 522d of the non-select memory cell 820. However, since a current-on voltage Vion is applied to the select memory cell 810, a read current may flow through both a semiconductor layer 522c and a resistance change layer 523c of the select memory cell 810.

Here, the current-on voltage Vion may have a magnitude so that a resistance of the semiconductor layer 522c is in a range similar to that of the resistance change layer 523c. The magnitude of the current-on voltage Vion may be such that a resistance of the semiconductor layer 522c corresponding to the select memory cell 810 is equal to or greater than a minimum resistance of a resistance change layer 523c corresponding to the select memory cell 810 or a resistance of the semiconductor layer 522c corresponding to the select memory cell 810 is equal to or less than a maximum resistance of the resistance change layer 523c corresponding to the select memory cell 810. Alternatively, when the resistance of the resistance change layer 523c is in a range of $10^4\Omega$ to $10^{12}\Omega$, the magnitude of the current-on voltage Vion may be in a range so that the resistance range of the semiconductor layer 522c is also in a range of $10^4\Omega$ to $10^{12}\Omega$. Alternatively, the magnitude of the current-on voltage Vion may be such that a ratio of the maximum value with respect to a minimum value of a composite resistance of the semiconductor layer 522c and the resistance change layer 523c of the select memory cell may be 10 or less. Thus, a total resistance of the select memory cell 810 may be determined as a parallel resistance of the resistance of the semiconductor layer 522c and the resistance of the resistance change layer 523c.

Since the total resistance of the select memory cell 810 is determined by the resistance of the parallel connection of the semiconductor layer 522c and the resistance change layer 523c, even if the resistance state of the resistance change layer 523c is a logarithmic scale, the overall resistance of the select memory cell 810 may have a linear scale distribution. In this way, the uniformity of the resistance state with respect to a memory cell may be improved and a certain range of current may be outputted from the select memory cell 710, and thus, the connection of a memory cell to a sense amplifier sensing the select memory cell 810 may be increased.

Figure 11A:
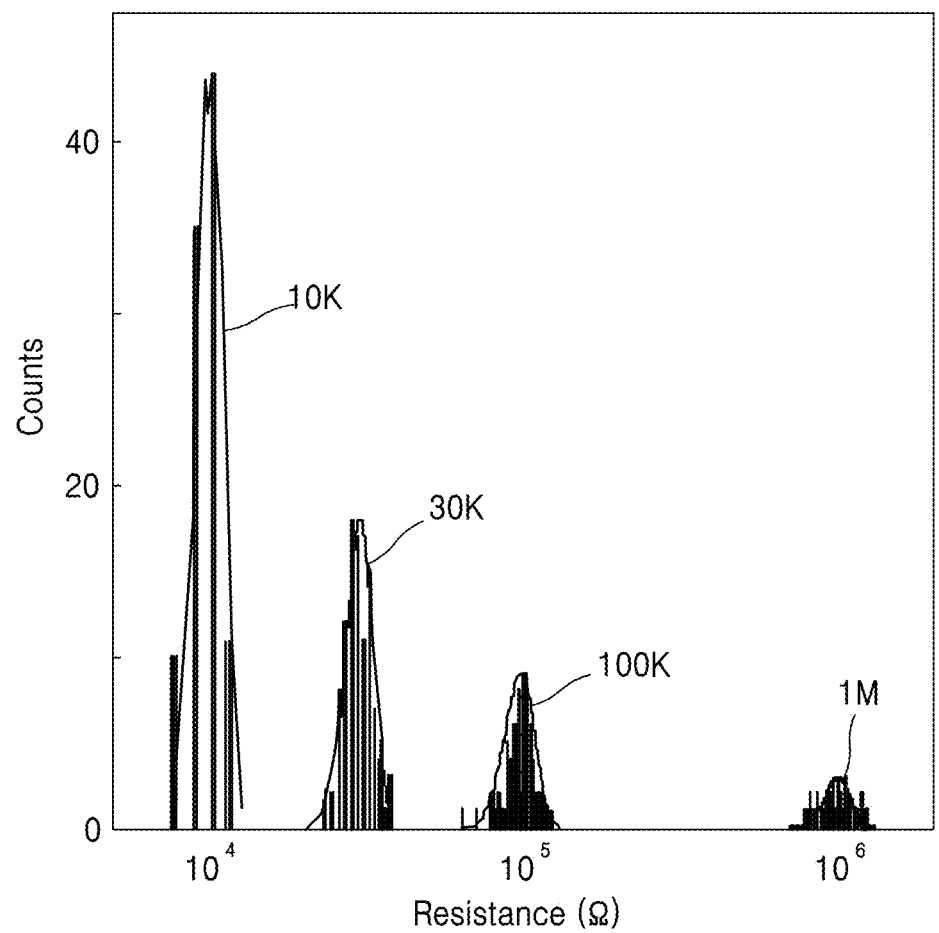
FIG. 11A is a diagram showing a resistance distribution when a current flows only in a resistance change layer.
Figure 11B:
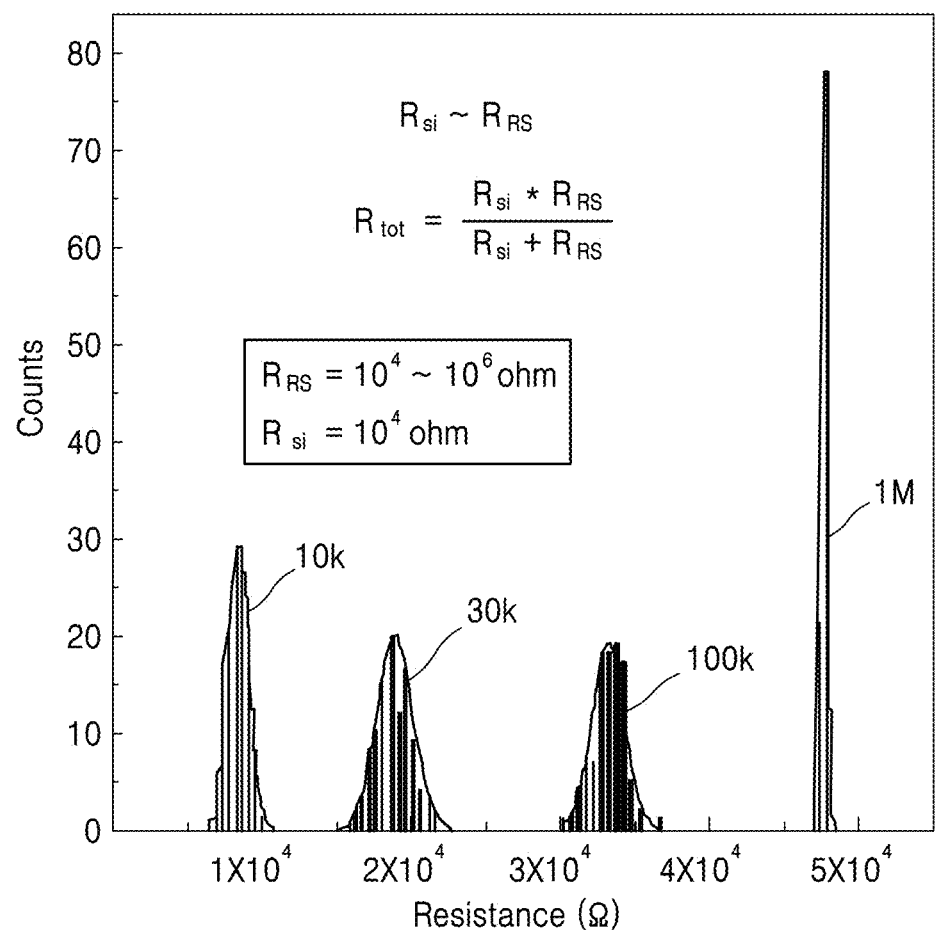
FIG. 11B is a diagram showing a resistance distribution when a current flows through a resistance change layer and a semiconductor layer.

FIG. 11A is a graph showing a resistance distribution when a current flows only in the resistance change layer 523c, and FIG. 11B is a graph showing a resistance distribution when a current flows through the resistance change layer 523c and the semiconductor layer 522c. FIG. 11A illustrates a resistance distribution of resistance average values of 10 k$\Omega$, 30 k$\Omega$, 100 k$\Omega$, and 1 M$\Omega$ having a normally formed random distribution based on an understanding with respect to a resistance change phenomenon of the resistance change layer 523c. The standard deviation of each of the above average values of resistance also shows 1 k$\Omega$, 3 k$\Omega$, 10 k$\Omega$, and 100 k$\Omega$ logarithmic scale distributions.

Meanwhile, it is assumed that the semiconductor layer 522c has a resistance value of about 10 k$\Omega$ in the read mode. Since the semiconductor layer 522c and the resistance change layer 523c are formed in a parallel circuit, the distribution of the composite resistance is as shown in FIG. 11B. Due to the presence of parallel resistors, it may be confirmed that an average value of each of the composite resistors is about 8.5 k$\Omega$, 18.9 k$\Omega$, 33.2 k$\Omega$, and 47.6$\Omega$ and has a linear scale distribution compared to the resistance change layer 523c. Also, it may be confirmed that each of the standard deviations is reduced to 0.6 k$\Omega$, 1.2 k$\Omega$, 1.1 k$\Omega$, and 0.2 k$\Omega$.

In a read operation, when a current is allowed to flow only in the resistance change layer 523 with the resistance distribution of FIG. 11A, a ratio of the highest resistance to the lowest resistance of the memory cell may be about 100. However, when a current is allowed to flow through both the semiconductor layer 522 and the resistance change layer 523, the memory cell may have a resistance distribution of FIG. 11B. Also, it may be confirmed that the ratio of the highest resistance to the lowest resistance of the memory cell is reduced to about 5 to 6. The connection of the memory cell to the sense amplifier may be facilitated by reducing the deviation of a signal outputted from the memory cell.

According to the present disclosure, a resistance value of a memory cell may be distributed in a linear scale range by applying a voltage in a range in which both the resistance change layer and the semiconductor layer are resistances to the memory cell of the nonvolatile memory device. This may improve the uniformity of a current output from the nonvolatile memory device. Also, the connection of the memory cell to a detection amplifier that detects a current of the nonvolatile memory device may be facilitated.

The foregoing descriptions of the present specification are examples, and thus, it will be understood by those skilled in the art that various changes in form and details may be made therein without departing from the spirit and scope of inventive concepts Therefore, it should be understood that the embodiments described above are non-limiting examples in all respects and not restrictive. For example, each component described as a single type may be implemented in a distributed manner, and similarly, components described as distributed may be implemented in a combined form.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A memory device comprising:
   a memory cell array having a vertical stack-type structure including a semiconductor layer and a resistance change layer, the memory cell array including a plurality of memory cells that each include a corresponding portion of the semiconductor layer and a corresponding portion of the resistance change layer; and
   a control logic,
      the control logic, in a read operation, being configured to apply a first voltage to a non-select memory cell and the first voltage has a level to turn on current only in the corresponding portion of the semiconductor layer of the non-select memory cell,
      the control logic, during the read operation, being configured to apply a second voltage to a select memory cell and the second voltage has a level to turn on current in both the corresponding portion of the semiconductor layer and the corresponding portion of the resistance change layer of the select memory cell, and
      the non-select memory cell and the select memory cell being among the plurality of memory cells of the memory cell array; and
   a bit line connected to the memory cell array, the bit line being configured to apply a read voltage to the select memory cell during the read operation,
   wherein the second voltage has a magnitude so that a resistance of the corresponding portion of the semiconductor layer corresponding of the select memory cell is equal to or greater than a minimum resistance of the corresponding portion of the resistance change layer of the select memory cell, based on the control logic applying the second voltage to the select memory cell.

2. The memory device of claim 1, wherein,
   the control logic, in a program operation, is configured to apply the first voltage to the non-select memory cell to turn on current only in the corresponding portion of the semiconductor layer of the non-select memory cell, and the control logic, in the program operation, is configured to apply a third voltage to the select memory cell to turn on current only in the corresponding portion of the resistance change layer of the select memory cell, and the bit line is configured to apply a program voltage to the select memory cell during the program operation.

3. The memory device of claim 1, wherein the second voltage has a magnitude so that the corresponding portion of the semiconductor layer of the select memory cell has a resistance magnitude in a range of $10^4\Omega$ through $10^{12}\Omega$, based on the control logic applying the second voltage to the select memory cell.

4. The memory device of claim 1, wherein the second voltage has a magnitude so that a ratio of a maximum value to a minimum value of a composite resistance of the corresponding portion of the semiconductor layer and the corresponding portion of the resistance change layer of the select memory cell is 10 or less, based on the control logic applying the second voltage to the select memory cell.

5. The memory device of claim 1, wherein the second voltage has a magnitude so that a resistance of the corresponding portion of the semiconductor layer corresponding of the select memory cell is equal to or less than a maximum resistance of the corresponding portion of the resistance change layer corresponding to the select memory cell, based on the control logic applying the second voltage to the select memory cell.

6. The memory device of claim 1, wherein the corresponding portion of the semiconductor layer and the corresponding portion of the resistance change layer of the select memory cell have a parallel connection structure.

7. The memory device of claim 1, wherein the memory cell array includes:
the semiconductor layer extending in a first direction;
a plurality of gates and a plurality of insulating layers extending in a second direction perpendicular to the first direction and alternately disposed to each other;
a gate insulating layer extending in the first direction between the plurality of gates, the plurality of insulating layers, and the semiconductor layer; and
the resistance change layer extending in the first direction on the semiconductor layer.

8. The memory device of claim 7, wherein the resistance change layer is spaced apart from the gate insulating layer with the semiconductor layer therebetween.

9. The memory device of claim 7, wherein
the semiconductor layer includes a silicon material.

10. The memory device of claim 1, wherein the resistance change layer contacts the semiconductor layer.

11. The memory device of claim 1, wherein the resistance change layer includes a material in which a resistance is changed by a phenomenon of oxygen vacancies or a current conduction mechanism by trap/detrap of electrons.

12. The memory device of claim 1, wherein the resistance change layer includes one or more transition metal oxides, one or more transition metal nitrides, or both the one or more transition metal oxides and one or more transition metal nitrides.

13. A method of operating a non-volatile memory device, the method comprising:
applying a first voltage to a non-select memory cell among a plurality of memory cells of a memory cell array, the memory cell array having a vertical stack-type structure including a semiconductor layer and a resistance change layer, each of the plurality of memory cells including a corresponding portion of the semiconductor layer and a corresponding portion of the resistance change layer, and the first voltage having a level to turn on current only in the corresponding portion of the semiconductor layer of the non-select memory cell;
applying a second voltage to a select memory cell among the plurality of memory cells of the memory cell array, the second voltage having a level to turn on current in both the corresponding portion of the semiconductor layer and the corresponding portion of resistance change layer of the select memory cell; and
applying a read voltage to the select memory cell of the memory cell array,
wherein the second voltage has a magnitude so that a resistance of the corresponding portion of the semiconductor layer corresponding of the select memory cell is equal to or greater than a minimum resistance of the corresponding portion of the resistance change layer of the select memory cell, based on a control logic applying the second voltage to the select memory cell.

14. The method of claim 13, wherein the second voltage is less than the first voltage.

15. The method of claim 13, wherein
the second voltage is greater than a third voltage, and
the third voltage has a level to turn on current in the corresponding portion of the resistance change layer of the select memory cell of the memory cell array, based on applying the third voltage to the select memory cell.

16. The method of claim 13, wherein the second voltage has a magnitude so that a ratio of a maximum value to a minimum value of a composite resistance of the corresponding portion of the semiconductor layer and the corresponding portion of the resistance change layer of the select memory cell is 10 or less, based on applying the second voltage to the select memory cell.

17. The method of claim 13, wherein the corresponding portion of the semiconductor layer and the corresponding portion of the resistance change layer of the selected memory cell have a parallel connection structure.

18. A memory device comprising:
a substrate;
a plurality of cell strings on the substrate and spaced apart from each other,
each of the plurality of cells strings including a semiconductor layer and a resistance change layer on the substrate, each of the plurality of cell strings including a plurality of memory cells stacked on top of each other on a string selection transistor,
each memory cell of the plurality of memory cells in a same cell string among the plurality of cell strings each including a corresponding portion of the semiconductor layer and a corresponding portion of resistance change layer in the same cell string;
a plurality of bit lines on the substrate, each of the bit lines being connected to a corresponding one of the plurality of cell strings arranged in a same column on the substrate, the plurality of bit lines being configured to apply a read voltage to a select memory cell during a read operation using a selected bit line among the plurality of bit lines, the select memory cell and a non-select memory cell being among the plurality of memory cells on the substrate;
a plurality of word lines on the substrate, each of the plurality of word lines being connected to the plurality of memory cells at a same height among the plurality of cell strings arranged in a same row on the substrate; and a control logic, the control logic, in the read operation, being configured to apply a first voltage to a non-select memory cell using an unselected word line among the plurality of word lines, the first voltage having a level to turn on current only in the corresponding portion of the semiconductor layer of the non-select memory cell, the control logic, during the read operation, being configured to apply a second voltage to the select memory cell using a selected word line among the plurality of word lines, the second voltage having a level to turn on current in both the corresponding portion of the semiconductor layer and the corresponding portion of the resistance change layer of the select memory cell, wherein the second voltage has a magnitude so that a resistance of the corresponding portion of the semiconductor layer corresponding of the select memory cell is equal to or greater than a minimum resistance of the corresponding portion of the resistance change layer of the select memory cell, based on the control logic applying the second voltage to the select memory cell.

19. The memory device of claim 18, wherein the resistance change layer includes one or more transition metal oxides, one or more transition metal nitrides, or both the one or more transition metal oxides and one or more transition metal nitrides.

20. The memory device of claim 18, wherein the corresponding portion of the semiconductor layer and the corresponding portion of the resistance change layer, of a same memory cell among the plurality of memory cells, having a parallel connection structure.

21. The memory device of claim 20, further comprising:
a common source line in the substrate, wherein
two or more of the plurality of cell strings are on the common source line, and each of the plurality of cell strings further includes a gate insulating layer contacting a first surface of the semiconductor layer that is opposite a second surface of the semiconductor layer that directly contacts the resistance change layer.

* * * * *